United States Patent [19]
Kobayashi

[11] Patent Number: 6,057,691
[45] Date of Patent: May 2, 2000

[54] DELAY ELEMENT TESTING APPARATUS AND INTEGRATED CIRCUIT HAVING TESTING FUNCTION FOR DELAY ELEMENTS

[75] Inventor: Norifumi Kobayashi, Yokohama, Japan

[73] Assignee: Kabushiki Kaisha Toshiba, Kawasaki, Japan

[21] Appl. No.: 08/884,161

[22] Filed: Jun. 27, 1997

[30] Foreign Application Priority Data

Jun. 27, 1996 [JP] Japan .................................. 8-167361

[51] Int. Cl.⁷ .............................. G08B 1/08; H01L 27/06
[52] U.S. Cl. .................... 324/617; 324/76.82; 324/76.77
[58] Field of Search ........................... 368/117; 327/149, 327/158; 324/617, 76.77, 76.82

[56] References Cited

U.S. PATENT DOCUMENTS

| | | | |
|---|---|---|---|
| 2,889,515 | 6/1959 | Murphy | 368/117 |
| 4,118,665 | 10/1978 | Reinhardt | 324/617 |
| 5,396,183 | 3/1995 | Farwell | 324/617 |
| 5,471,145 | 11/1995 | Mydill | 324/617 |
| 5,675,265 | 10/1997 | Yamamori | 324/617 |
| 5,764,598 | 6/1998 | Okayasu | 368/117 |

*Primary Examiner*—Josie Ballato
*Assistant Examiner*—Jose M. Solis
*Attorney, Agent, or Firm*—Foley & Lardner

[57] ABSTRACT

A delay element testing apparatus has a signal generator for generating a plurality of signals, at least one of which is variable in timing; a phase comparator for making a comparison of a relationship in terms of phasic anteriority and posteriority between the signal passing through a delay element under test and the timing-variable signal among the plurality of signals; and a test result output circuit, controlled by a control signal generated by the phase comparator, for outputting a signal indicating a quality of a delay characteristic of the delay element under test. Main parts of this testing apparatus can be provided on a substrate to realize an integrated having a function for testing delay elements included therein.

10 Claims, 4 Drawing Sheets

DELAY ELEMENT TESTING APPARATUS AND INTEGRATED CIRCUIT HAVING TESTING FUNCTION FOR DELAY ELEMENTS

BACKGROUND OF THE INVENTION

The present invention relates to an apparatus for testing a variable delay element utilized for measuring devices such as a pulse generator and a timing generating unit of an LSI tester, and for a timing adjusting circuit in an LSI, and also to an integrated circuit incorporating a testing function for testing delay elements included therein.

The variable delay element has a function to delay a signal in accordance with a arbitrarily set control signal, and is capable of actualizing delay times of kinds the number of which is obtained by normally raising 2 to a control bit number-th power.

A test for a performance of such a variable delay element with respect to each delay time might generally involve the use of an expensive measuring device and a large amount of time The followings are descriptions of testing methods that have hitherto been practiced.

A first method involves the use of an LSI tester and a separate measuring device, wherein a measurement reference signal with a repetition of "1" and "0" of a logic level is delayed by a variable delay element to the measured, and a rising or falling edge delayed by the variable delay element is detected by use of a reference signal of the measuring device, thereby obtaining a delay quantity.

This technique entails a high-performance LSI tester or a separate measuring device that are capable of generating a fine delay. Further, it is time-consuming to test sequentially the delay elements one by one, and a running cost for the measuring device is high. Moreover, since a boundary of the edge is sought by searching, and hence a timing of the reference signal for searching is controlled. Therefore, a high-performance control system CPU is needed, and besides the test requires the immense time.

A second method is a technique utilized for evaluating an a.c. characteristic of the LSI, wherein a ring oscillator is constructed including the variable delay element to be measured, and an oscillation frequency is measured by a frequency measuring device. That is to say, the delay quantity can be obtained from a variation in the frequency when changing delay setting of the variable delay element.

According to the second method, the test putting an emphasis on only one of the rise and the fall of the waveform is insufficient in terms of a constraint in the circuit of the ring oscillator, and a duty ratio is also required to be measured. Therefore, this involves the use of special circuit and measuring device. Further, a lot of data must be exchanged between a measuring system and a control system, which might take a huge quantity of time.

A third method is a technique by which a pulse signal corresponding to a phase difference between a signal to be tested and a reference signal is obtained, integrated and converted into a voltage, and a voltage value thereof is subjected to analog to digital conversion, thus obtaining a delay quantity.

According to the third method, an integration of pulses during a fixed period is needed for obtaining the voltage value, and a much measuring time is required. Furthermore, the voltage value obtained does not necessarily fall within a convertible range of an A/D converter at all times, and a timing of the reference signal is required to be adjusted corresponding to the delay quantity. Then, the measurement itself becomes complicated.

As described above, any of the delay element testing methods conventionally used has such a defect that the expensive measuring device is needed, and the measurement is complicated enough to take much measuring time.

SUMMARY OF THE INVENTION

Under such circumstances, it is a primary object of the present invention to provide a delay element testing apparatus capable of testing a delay element at a required precision with a minimized hardware system at a high speed as well as at a low cost.

According to a first aspect of the present invention, there is provided a delay element testing apparatus having:

a signal generator for generating a plurality of signals, at least one of which is variable in timing;

a phase comparator for making a comparison of a relationship in terms of phasic anteriority and posteriority between the signal passing through a delay element under test and the timing-variable signal among the plurality of signals; and a test result output circuit, controlled by a control signal generated by said phase comparator, for outputting a signal indicating a quality of a delay characteristic of said delay element under test.

Since the delay element testing apparatus according to the present invention includes a phase comparator for making a comparison of a relationship in terms of phasic anteriority and posteriority between a known timing-variable signal and a signal passing through a delay element under test, a characteristic of a delay element can be obtained based on a phasic judgement at a high speed with a simple construction.

It is a second object of the present invention to provide an integrated circuit having a test function for testing a delay element included therein According to a secondary aspect of the present invention, there is provided a semiconductor integrated circuit incorporating a testing function, having:

a phase comparator, connected to an outside signal generator for generating a plurality of signals at least one of which is variable in timing, for making a comparison of a relationship in terms of phasic anteriority and posteriority between the signal passing through a delay element under test and the timing-variable signal among the plurality of signals; and a test result output circuit, controlled by a control signal generated by sad phase comparator, for outputting a signal indicating a quality of a delay characteristic of said delay element under test, wherein said phase comparator and said test result output circuit are provided on the same substrate

DESCRIPTION OF THE PREFERRED EMBODIMENTS

Some embodiments of the present invention will hereinafter be described with reference to the drawings.

Figure 1:
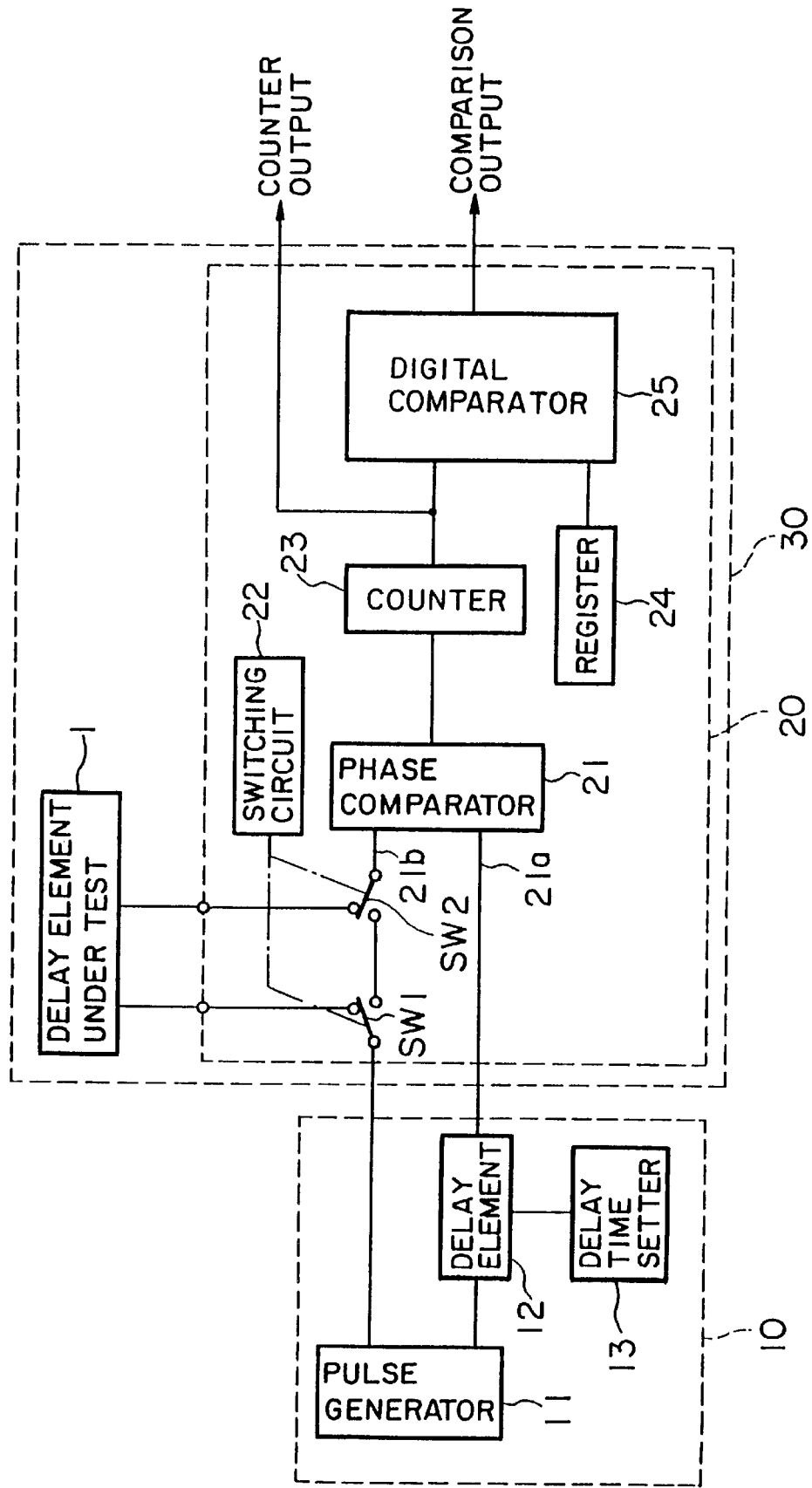
FIG. 1 is a block diagram showing a construction of a delay element testing apparatus in a first embodiment of the present invention.

FIG. 1 is a block diagram schematically illustrating a construction of a delay element testing apparatus according to a first embodiment of the present invention. This testing apparatus is roughly separated into a pulse generating module 10 and a testing circuit module 20.

The pulse generating module 10 includes a pulse generator 11 having output terminals for two systems, a delay element 12 connected to one of the output terminals, and a delay time setter 13 for setting a delay time of this delay element 12 to a known arbitrary time. This delay element 12 is required to have a performance higher than that of a delay element under test, and it is feasible to make use of a generally commercially available general-purpose IC and of a function of an LSI tester.

Further, the testing circuit module 20 includes a phase comparator 21 having a first input terminal 21a for receiving outputs passing through the delay element 12 among first outputs of the pulse generator 11 and a second input terminal 21b for receiving outputs passing through the delay element under test 1 among second outputs of the pulse generator 11. The test circuit module 20 also includes a counter 23 for counting the outputs thereof, a register 24 for storing an expected value of the delay time, and a digital comparator 25 for comparing an output of the counter 23 with an output of the register 24. Provided further is switching circuit 22 for controlling switches SW1, SW2 so that the output of the pulse generator is directly supplied to the phase comparator 21 when the delay element under test is not incorporated.

Next, an operation of this circuit will be explained.

A reference pulse generated by the pulse generator 11 and passing through the delay element 12 and a reference pulse generated thereby and passing through the delay element under test, are inputted to the phase comparator 21. This phase comparator 21 makes a comparison of a relationship in terms of phasic anteriority and posteriority between a reference signal and a tested signal.

The counter is operated based on a result of this comparison. To start with, the reference signal is changed up to a timing more delayed than the tested signal while a delay quantity of the delay element provided on a path for the reference signal is sequentially increased with a start from a sufficiently earlier phase than the tested signal. A counter operation at this time is that the counter is in a count-enable state during a period when the tested signal is delayed longer than the reference signal, and is in a count-disable state when in equi-phase and when the tested signal is in a phase earlier than the reference measuring signal.

Figure 2:
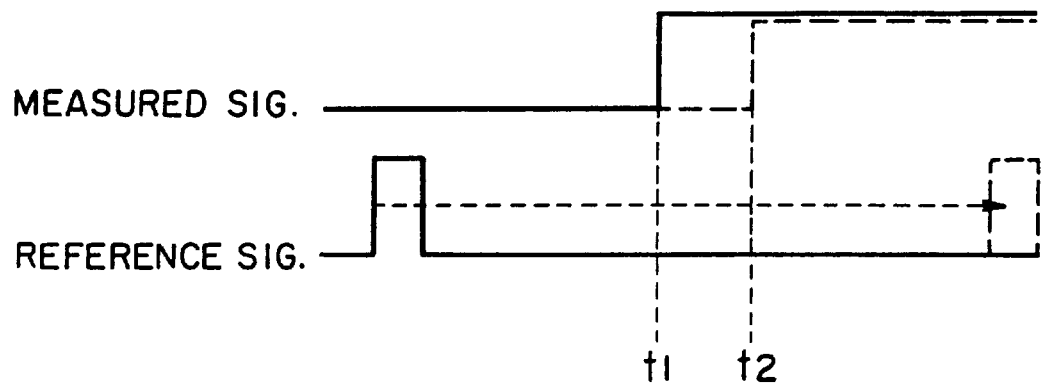
FIG. 2 is a timing chart showing a measuring operation in the first embodiment of the present invention.

This operation will be explained with reference to a timing chart of FIG. 2.

When a control signal of the delay element under test 1 is in an initial state, it is assumed that a rising edge of the tested signal passing through the delay element under test 1 is in a position of a point 0 (t1). In this state, delay setting of the reference delay element 12 is incremented to make the reference signal approach the point 0 (t1). An output of the phase comparator 21 is in the count-enable state just before the point 0 (t1), and hence the counter 23 operates. If the delay setting of the reference delay element 12 continues to be incremented, the reference signal reaches the point 0 (t1), and an output of the phase comparator 21 is put into the count-disable state, whereby the operation of the counter 23 stops. Just when the increment of the delay setting comes to an end, output data of the counter 23 is read back, and this item of read-back data is set as an initial value. It follows that a skew due to a variety of factors of both of the pulse generating module 10 and the testing circuit module 20, is measured by the operations conducted so far.

Next, the control signal of the tested element 1 is changed, and there is produced a state in which to generate a delay to be tested. Then, the expected value storage register 24 is stored with data into which an expected delay value is added to the initial value. In this state, the delay setting of the reference delay element 12 is incremented to make the reference signal approach a point 1 (t2). At this time also, as in the same way with the above-mentioned, the counter 23 operates because of being in the counter-enable state till the reference signal reaches the point 1 (t2). Then, the counter 23 stops because of becoming the count-disable state after reaching the point 1 (t2). Just when the increment is finished, a quality of the delay element under test 1 is judged depending on whether to be coincident with the expected value by referring to the output of the digital comparator 25.

It is feasible to test all the states of the delay element under test 1 by repeating the same operations while hereinafter sequentially changing the control signal of the delay element under test 1.

Further, if a quantitative delay time is required in addition to the quality judgement, this can be easily arithmetically obtained by reading back the output data of the counter and making use of this item of read-back data and a resolution of the delay time setting of the reference signal.

In accordance with this embodiment, the delay element under test 1 is connected to the testing circuit module 20. If an integrated circuit 30 including the delay element under test 1 incorporates the construction of the testing circuit module 20, however, the delay element can be measured simply by inputting the reference signal to the integrated circuit from outside. It is therefore feasible to simultaneously test a plurality of integrated circuits incorporating the delay elements, whereby the test can be speeded up.

Figure 3:
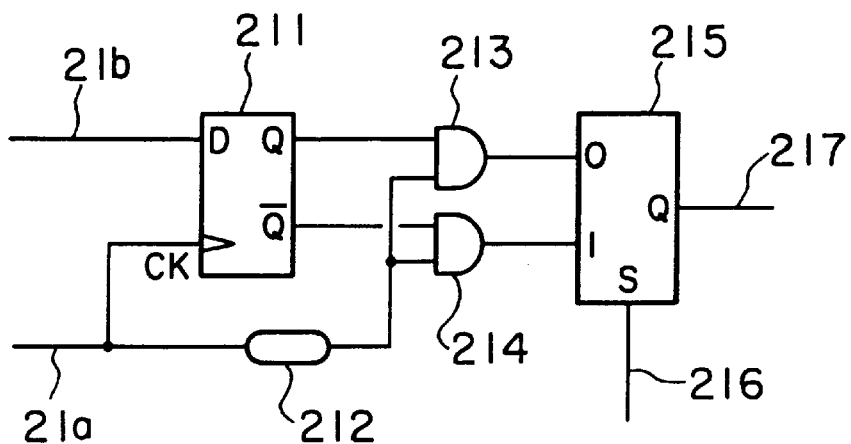
FIG. 3 is a circuit diagram showing a detailed configuration of a circuit of a phase comparator in the first embodiment of the present invention.

FIG. 3 is a circuit diagram showing one example of the phase comparator 21.

This circuit comprises a D-type flip-flop 21 in which a signal input 21b passing through the delay element under test is set as a D-input while signal input 21a passing through the reference delay element is set as a clock input. This circuit also comprises 2-input AND gates 213, 214 in which one inputs are an output Q and an inverted output Q and the other inputs are delayed inputs obtained by delaying signal inputs 21a with a delay element 212, and a multiplexer 215 for arbitrarily switching outputs of the two 2-input AND gates 213, 214.

In such a circuit, if the rising signal is an output of the delay element under test, a counter control signal 217 can be generated by setting a control signal 216 of the multiplexer 215 to "1". On the other hand, if the rising signal is an output of the delay element under test, the counter control signal 217 can be similarly generated by setting the control signal 216 of the multiplexer 215 to "0". Accordingly, it is recognizable that the test can be performed irrespective of a rise and a fall of the edge.

Figure 4:
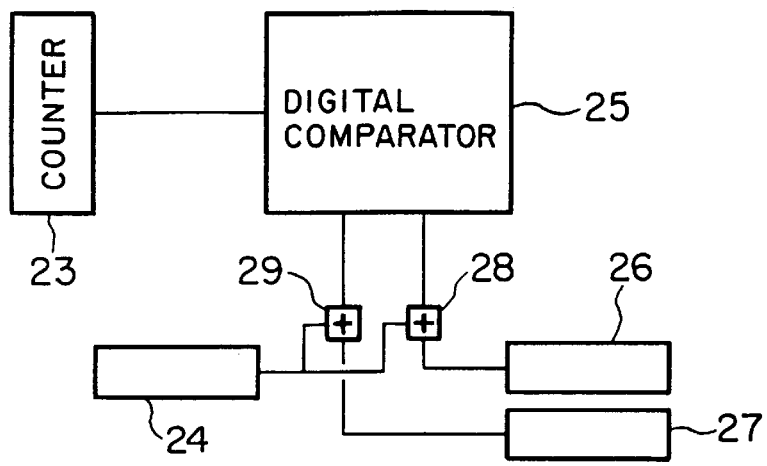
FIG. 4 is a block diagram illustrating a part of constructions of the delay element testing apparatus according to a second embodiment of the present invention.

FIG. 4 is a block diagram showing a second embodiment of the present invention. The register 24 is modified in form in terms of a relationship between the counter 23, the register 24 and the digital comparator 25 which are shown in FIG. 1.

Provided in the second embodiment are a upper limit expected value storage register 26 for storing an upper limit expected value as an expected value inputted to the digital comparator 25, a lower limit expected value storage register 27 for storing a lower limit expected value, an initial value storage register 24 for storing an initial value, an adder 28 for adding the initial value to the upper limit expected value, and an adder 29 for adding the initial value to the lower limit expected value.

With this construction, a real LSI test can be executed even in such a case that a delay quantity of the delay element under test 1 has a large scatter due to a variety of factors.

FIGS. 5A–5D are explanatory diagrams showing various cases of a relationship with the pulse generator when a measuring circuit module is actualized as a part of the LSI.

Figure 5A:
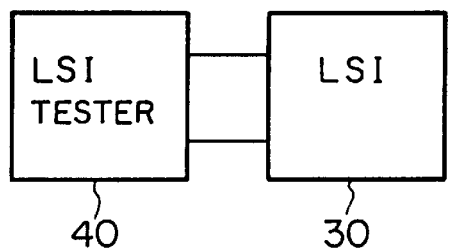
FIGS. 5A–5D are explanatory diagrams showing that the present invention is applicable in a variety of modes when incorporating a test circuit module having the construction shown in FIG. 1 into an integrated circuit.

FIG. 5a illustrates a construction in which the pulse generator 11 and the reference delay element 12 in the first embodiment shown in FIG. 1 are all replaced with an LSI tester 40.

Figure 5B:
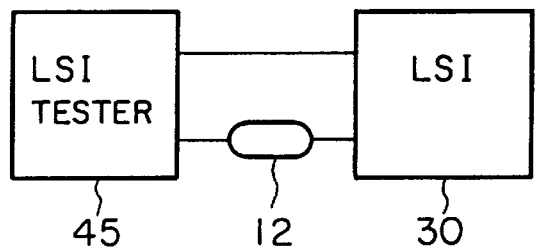

FIG. 5b illustrates a construction in which an LSI tester 45 exhibiting a comparatively low performance is combined with the reference delay element 12.

Figure 5C:
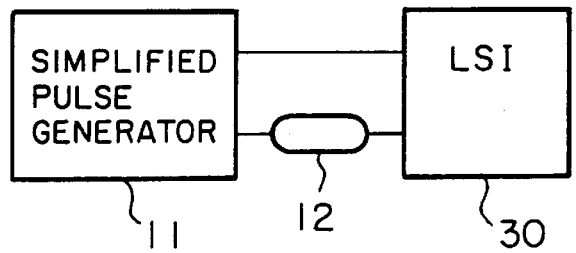

FIG. 5c shows a construction in which a simplified pulse generator 11 is, as in the case of FIG. 1, combined with the reference delay element 12.

Figure 5D:
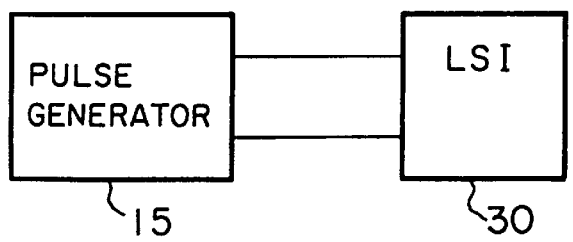

FIG. 5d shows a construction based on only a high-performance pulse generator 15 capable of freely setting the delay time.

As discussed above, the present invention can be embodied in a variety of modes.

Figure 6:
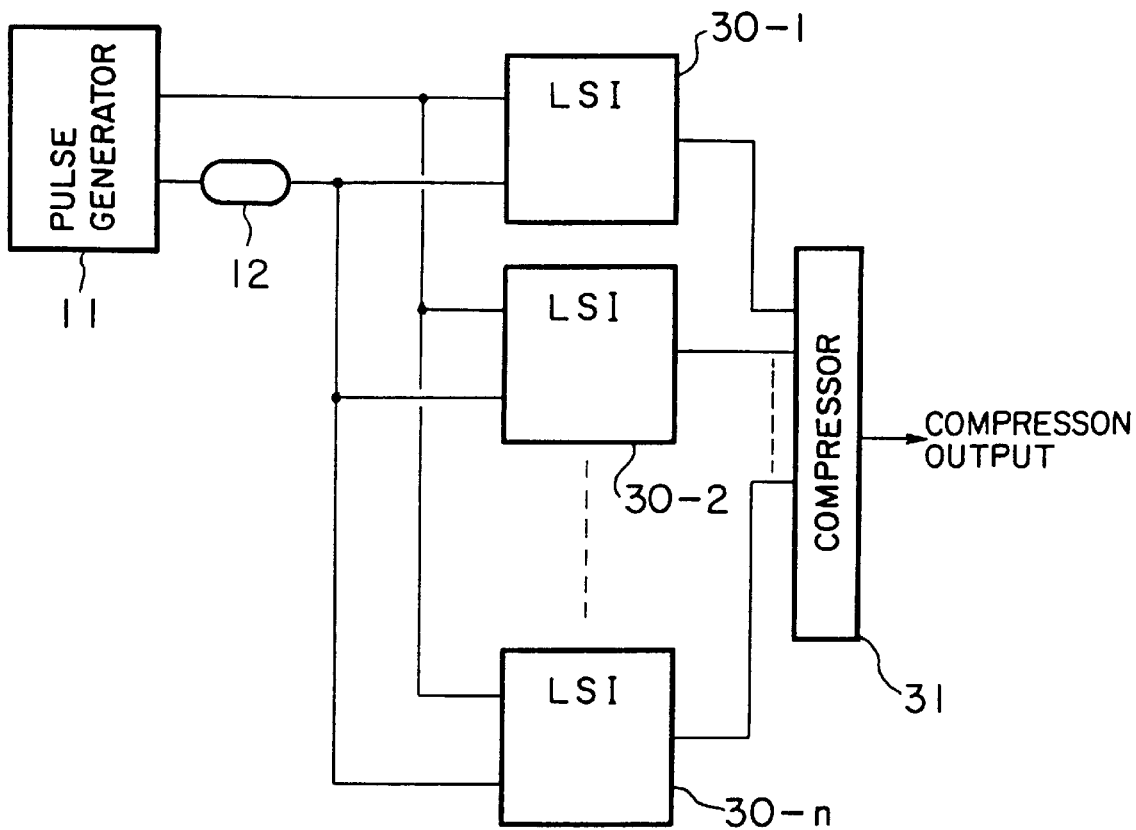
FIG. 6 is a block diagram showing a third embodiment of the present invention, wherein a delay element is tested with respect to a plurality of LSIs.

A third embodiment of the present invention will be explained with reference to FIG. 6. In the third embodiment, a plurality of LSIs 30-1 to 30-n incorporating variable delay elements are simultaneously tested. For this purpose, one output signal of the signal pulse generator 11 is delayed by the reference variable delay element 12 and paired with another output signal of the pulse generator. Each of the plurality of LSIs 30-1 to 30-n is supplied with the paired output signals, and output data from those LSIs are compressed by a compressor 31 and then outputted.

In this case, the quality judgement is made based on the compressed output of the compressor 31, whereby the qualities of the plurality of LSIs 30-1 to 30-n can be judged at one time. Namely, only when judged to be defective by the compressed data, it is possible to specify which LSI is defective with reference to the output of the digital comparator 25 of each LSI.

According to such a method, there is no limit in the number of LSIs that can be simultaneously tested, and the test can be efficiently done.

Figure 7:
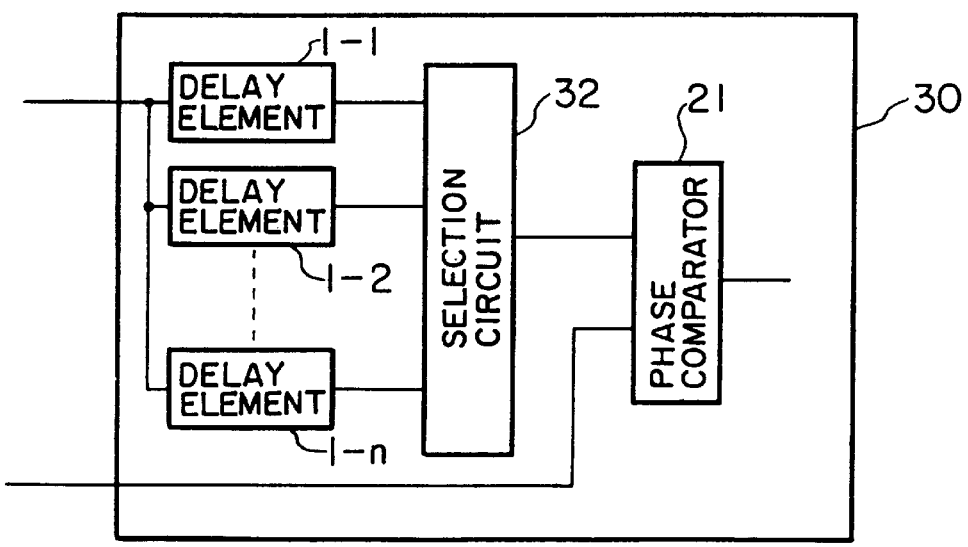
FIG. 7 is a block diagram showing a fourth embodiment of the present invention, wherein a test is effected in such a case as to have a plurality of delay elements in the LSI.

FIG. 7 is a block diagram showing a fourth embodiment of the present invention. In the fourth embodiment, the same LSI 30 incorporates a plurality of variable delay elements 1-1 through 1-n, and one of the plurality of variable delay elements is selected by a selecting circuit 32 and then supplied to phase comparator 21. That is, a tested signal defined as an output signal of the variable delay element 1-1 selected by the selecting circuit 32, is inputted, and the relevant variable delay element is tested by repeating the same operations as those in the first embodiment discussed above. After finishing this test, all the variable delay elements are sequentially tested by changing a control signal of the selecting circuit 32. Note that if there might be an extra space, the variable delay element can incorporate the phase comparator and the counter in a one-to-one relationship without providing the selecting circuit.

As discussed above, according to the present invention, the testing circuit module makes the phasic comparison between the reference pulse by which the delay time obtained in the pulse generating module can be precisely set and the test pulse passing through the delay element under test. It is therefore possible to carry out the test at a high speed and a high precision.

The testing circuit module can be incorporated into the integrated circuit, particularly in the LSI. If thus constructed, a change in the integrated circuit is minimized, and consequently the high-speed measurement can be done. In particular, the plurality of LSI s can be simultaneously tested, and a testing efficiency is enhanced Further, there is no receipt and transfer of the data between a CPU in the control system and the measuring system during the test, and hence the quality of the delay element is judged at the high speed.

The present invention is applicable to a delivery test and a receiving test by the LSI tester and also applicable after incorporating the variable delay element built-in LSI into the real system.

Moreover, if the delay time of the reference signal can be freely determined, its mode is not a matter of consideration, and hence the testing system can be optimized corresponding to the testing apparatus applied and a testing target object.

Further, in the integrated circuit according to the present invention, the phase comparator and the test result output unit are mounted on the same substrate, and it is therefore possible to easily implement a delay characteristic test of the delay element within the integrated circuit simply by making the connection to the pulse generating module.

What is claimed is:

1. A delay element testing apparatus comprising:
    a signal generator for generating a plurality of signals, at least one of which is variable in timing;
    a phase comparator for making a comparison of a relationship in terms of phasic anteriority and posteriority between the signal passing through a delay element under test and the timing-variable signal among the plurality of signals; and
    a test result output circuit, controlled by a control signal generated by said phase comparator, for outputting data indicating a quality of a delay characteristic of said delay element under test.

2. The delay element testing device according to claim 1, wherein said test result output circuit includes a counter controlled by the output of said phase comparator.

3. The delay element testing apparatus according to claim 2, wherein said test result output circuit further includes comparing means for comparing an output of said counter with a stored content of a storage unit for storing a judgement reference value.

4. The delay element testing apparatus according to claim 3, wherein said storage unit is an initial value storage register for storing an initial value.

5. The delay element testing apparatus according to claim 4, wherein said storage unit further includes an upper limit expected value register and a lower limit expected value register.

6. The delay element testing apparatus according to claim 5, wherein said delay element under test, said phase comparator and said test result output circuit are formed on the same integrated circuit.

7. The delay element testing apparatus according to claim 1, wherein a plurality of said integrated circuits each having said delay element under test, said phase comparator and said test result output circuit are connected to a pulse generator.

8. The delay element testing apparatus according to claim 7, further comprising a compressor for compressing output data of said test result output circuits of said plurality of integrated circuits and outputting data compressed by said compressor.

9. A delay element testing apparatus comprising:

a signal generator for generating a plurality of signals at least one of which is variable in timing;

a selecting circuit for selectively distributing the timing-variable signals among the plurality of signals to a plurality of delay elements under test;

a phase comparator for making a comparison of a relationship in terms of phasic anteriority and posteriority between the signals passing through said delay elements under test; and a test result output circuit controlled by a control signal generated by said phase comparator and indicating a quality of a delay characteristic of one of said delay elements under test.

10. A semiconductor integrated circuit incorporating a testing function, comprising:

a phase comparator, connected to an outside signal generator for generating a plurality of signals at least one of which is variable in timing, for making a comparison of a relationship in terms of phasic anteriority and posteriority between the signal passing through a delay element under test and the timing-variable signal among the plurality of signals; and a test result output circuit, controlled by a control signal generated by said phase comparator, for outputting a signal indicating a quality of a delay characteristic of said delay element under test, wherein said phase comparator and said test result output circuit are provided on the same substrate.

* * * * *